United States Patent
Lee (10) Patent No.: US 7,655,362 B2
(45) Date of Patent: Feb. 2, 2010

(54) MASKS OF SEMICONDUCTOR DEVICES AND METHODS OF FORMING MASK PATTERNS

(75) Inventor: Jun Seok Lee, Goyang (KR)

(73) Assignee: Dongbu Electronics Co., Ltd., Seoul (KR)

( * ) Notice: Subject to any disclaimer, the term of this patent is extended or adjusted under 35 U.S.C. 154(b) by 704 days.

(21) Appl. No.: 11/022,628

(22) Filed: Dec. 27, 2004

(65) Prior Publication Data

US 2005/0142457 A1 Jun. 30, 2005

(30) Foreign Application Priority Data

Dec. 27, 2003 (KR) .................. 10-2003-0098321

(51) Int. Cl.
*G03F 1/00* (2006.01)

(52) U.S. Cl. .......................... 430/5; 430/394

(58) Field of Classification Search .............. 430/5, 430/311, 322, 394

See application file for complete search history.

(56) References Cited

U.S. PATENT DOCUMENTS

| | | | | |
|---|---|---|---|---|
| 5,439,764 A | * | 8/1995 | Alter et al. ................ | 430/5 |
| 5,585,210 A | * | 12/1996 | Lee et al. ................... | 430/5 |
| 5,827,623 A | * | 10/1998 | Ishida et al. ............... | 430/5 |
| 6,338,922 B1 | * | 1/2002 | Liebmann et al. .......... | 430/5 |
| 6,818,480 B2 | * | 11/2004 | Lee et al. ................. | 438/128 |
| 2002/0025479 A1 | * | 2/2002 | Okamoto et al. ........... | 430/5 |
| 2002/0127479 A1 | * | 9/2002 | Pierrat ...................... | 430/5 |
| 2004/0053141 A1 | * | 3/2004 | Pierrat ...................... | 430/5 |
| 2005/0136338 A1 | * | 6/2005 | Chang ....................... | 430/5 |

* cited by examiner

*Primary Examiner*—Mark F Huff
*Assistant Examiner*—Stewart A Fraser
(74) *Attorney, Agent, or Firm*—The Law Offices of Andrew D. Fortney; Andrew D. Fortney (57) ABSTRACT

Masks for semiconductor devices and methods of forming masks of semiconductor devices are provided which are capable of improving line resolution. A disclosed mask includes: a first mask pattern disposed on a first side of the mask. The first mask pattern includes light-blocking patterns and light-blocking fine auxiliary patterns within a light-transmitting region. The mask also includes a second mask pattern disposed on a second side of the mask. The second mask pattern includes light-transmitting fine auxiliary patterns within a light-blocking region. The light-transmitting fine auxiliary patterns are disposed at positions corresponding to the light-blocking fine auxiliary patterns to facilitate an overlapping exposing process. The second mask has the opposite tone of the first mask, and the second mask is disposed at a position horizontally-translated from a position of the first mask. Accordingly, pattern bridge regions in repeated patterns of a poly-cell transistor device can be selectively removed.

19 Claims, 7 Drawing Sheets

MASKS OF SEMICONDUCTOR DEVICES AND METHODS OF FORMING MASK PATTERNS

FIELD OF THE DISCLOSURE

The present disclosure relates generally to semiconductor fabrication, and more particularly, to masks of semiconductor devices and methods of forming mask patterns capable of improving line resolution by using an overlapping exposing process.

BACKGROUND

In general, the mask pattern forming technique used in a semiconductor fabrication process has an important effect on the accuracy of patterns formed on a semiconductor substrate. In particular, as the degree of integration of the patterns of semiconductor devices increases, spaces for optical proximity correction patterns become insufficient, and unwanted pattern bridges occur between lines during a lithography exposing process. Therefore, characteristics of the semiconductor device may be degraded.

On the other hand, by using semiconductor photolithography, masks can be designed with high accuracy, so that the amount of light passing through the masks can be suitably adjusted. In addition, an optical proximity correction technique and a phase shifting mask technique have been proposed. Further, various approaches for minimizing light distortion due to mask patterns have been proposed.

Recently, a chemical amplifying resist has been developed. The chemical amplifying resist is sensitive to 248 nm or 194 nm extreme ultra-violet (EUV) light. By using the chemical amplifying resist, the resolution can be further improved. In particular, by using dummy patterns separated from main patterns, the optical proximity effect can be controlled to improve the resolution.

Figure 1:
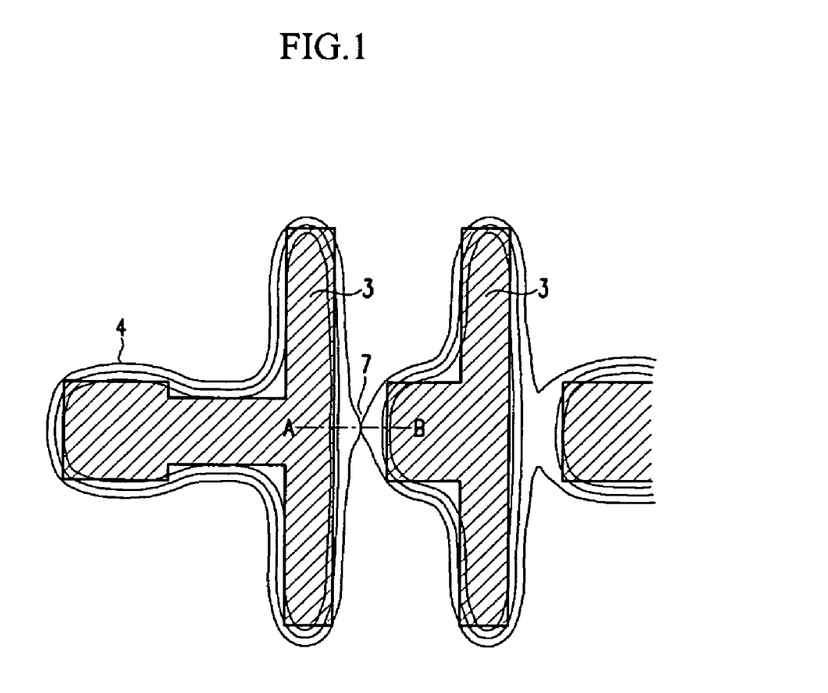
FIG. 1 is a schematic illustration showing a portion of a conventional semiconductor device mask corresponding to cells in an SRAM.

FIG. 1 is a schematic illustration showing a portion of a conventional semiconductor device mask corresponding to cells in a static random access memory (SRAM). Referring to FIG. 1, cell patterns 3 are repeatedly disposed. In the case of cell patterns having a dark tone, image contours 4 occur, depending on the intensity of the light passing though the mask. In FIG. 1, three image contours 4 are shown reflecting three different light intensities. The outmost contour corresponds to a case where the exposing light is insufficient. If the exposing light is too insufficient, a pattern bridge is first formed at a region 7 between the cell patterns 3. The region 7 is, therefore, defined as a threshold region for limiting the pattern resolution and the exposing process margin. The process margin in the cross section taken along line A-B is smallest.

Figure 2:
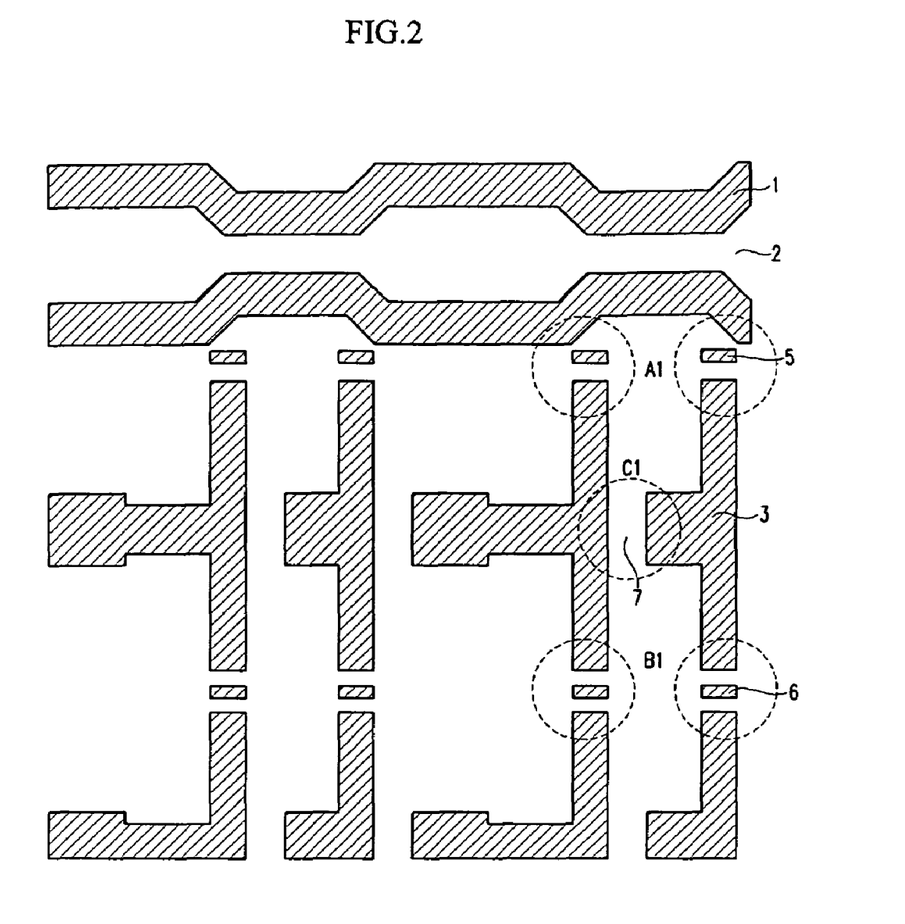
FIG. 2 is a schematic illustration showing pattern bridge problems in end portions of lines of a conventional semiconductor device mask.

FIG. 2 is a schematic illustration showing pattern bridge problems in end portions of lines of a conventional semiconductor device mask. In general, fine auxiliary patterns 5 and 6 are disposed at positions separated by a predetermined distance from the end portions of lines in order to maximally extend the lines. As described above, if the exposing light is insufficient, pattern bridges may occur at regions A1, B1, and C1 in a memory cell. In the example of FIG. 2, the memory cell includes repeated cell patterns 3 and driving transistors 1 disposed perpendicular to the cell patterns 3. The regions A1 are regions between the driving transistors 1 and NMOS cells; the regions B1 are regions between the driving transistors 1 and PMOS cells; and the regions C1 are regions between the cell patterns 3 in the horizontal direction.

As mentioned above, fine auxiliary patterns 5, 6 are disposed at the regions A1 and B1 in order to extend the end portions of the lines. Since the occurrence of pattern bridges at the region C1 are particularly problematic, fine auxiliary patterns are not inserted into the regions C1.

Pattern resolution is defined by the following Equation 1 (Rayleigh's Equation):

$$R = k \cdot \lambda / NA \qquad \text{[Equation 1]}$$

In this equation, k is a constant; $\lambda$ is a wavelength of an illuminated light of an illumination system; and NA is a diameter of a lens of the illumination system. Assuming that k, $\lambda$, and NA are 0.5, 0.248, and 0.66, respectively, the obtained resolution R is 0.19 μm. If a fine pattern having a line width less than the obtained resolution is independently applied to a mask, a pattern where light physically passes only though the mask but does not appear in the photoresist material can be defined.

Figure 3:
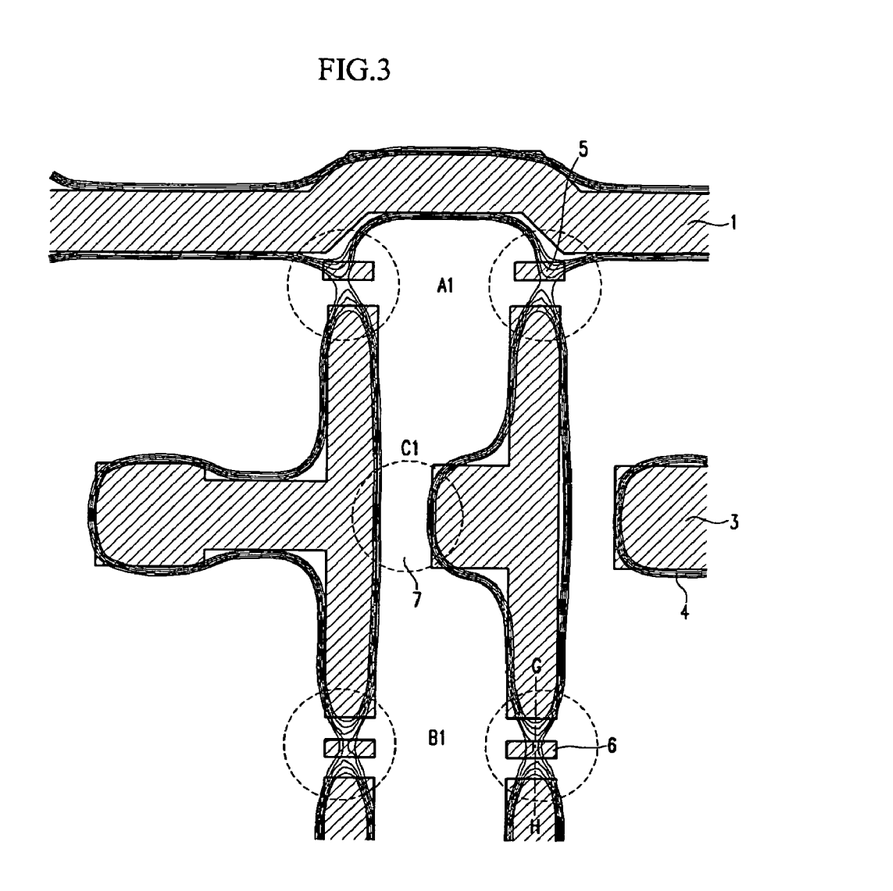
FIG. 3 is a schematic illustration showing overlapped contour images in a case where the conventional mask of FIG. 2 is used for an exposing process.

FIG. 3 is a schematic illustration showing overlapped contour images 4 in a case where the conventional mask of FIG. 2 is used for an exposing process. In FIG. 3, the contour images corresponding to a range of exposing conditions from an optimal exposing condition to an insufficient exposing condition are depicted. In FIG. 3, the outmost image 4 corresponds to the insufficient exposing condition. In addition, line G-H indicates an end portion of a cell line where a pattern bridge occurs.

In addition, if the line width increases due to a processing bias, or if the polarization degree of a semiconductor device is not good, a problem occurs in that a deviation may occur depending on the positions.

DETAILED DESCRIPTION

Figure 4:
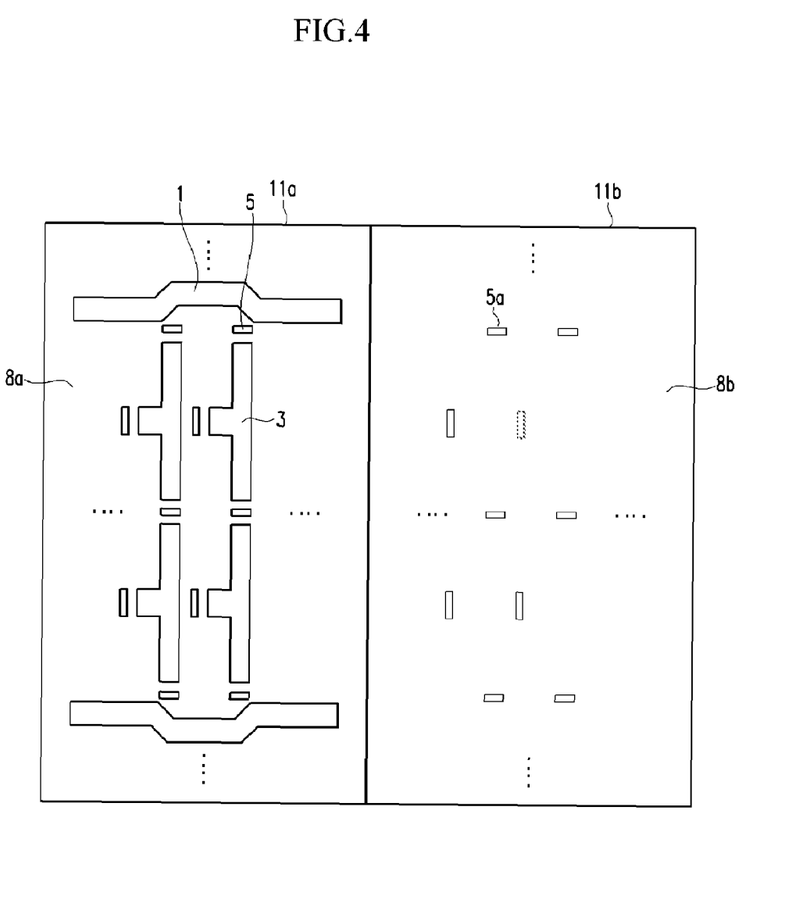
FIG. 4 is a schematic illustration showing an example semiconductor device mask and an associated example mask pattern constructed in accordance with the teachings of the present invention.

An example mask of a semiconductor device and an example method of forming a mask pattern will now be described with reference to the accompanying drawings. FIG. 4 is a schematic illustration showing an example semiconductor device mask and an associated example mask pattern constructed in accordance with the teachings of the present invention.

The illustrated mask includes two mask regions 11a, 11b. In FIG. 4, a mask formed in the left-handed mask region 11a is the same as a conventional mask. Another mask formed in the right-hand mask region 11b has the opposite tone of the mask formed in the left mask region 11a. In addition, in the right mask region 11b, only the fine auxiliary patterns 5a are formed at the corresponding positions of the fine auxiliary patterns 5 in the left mask region 11a. In the left mask region 11a, the mask cells 3, the driving element patterns 1, and the fine auxiliary patterns 5 are formed as light-blocking regions within a light-transmitting region 8a. In the right mask region 11b, the fine auxiliary patterns 5a are formed as light-transmitting regions within a light-blocking region 8b.

Figure 5:
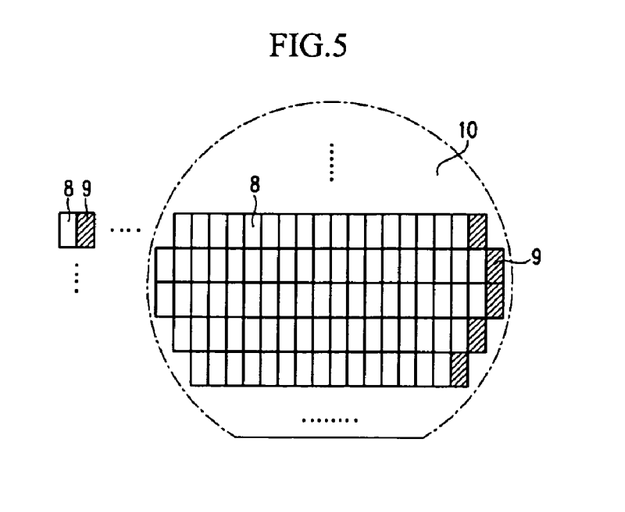
FIG. 5 is a schematic illustration showing individual chips on an example semiconductor substrate subject to an example overlapping exposing process performed in accordance with the teachings of the present invention.

FIG. 5 is a schematic illustration showing individual chips on an example semiconductor substrate subject to an example overlapping exposing process performed in accordance with the teachings of the present invention. Referring to FIG. 5, assuming that the exposing process starts from the left edge of the semiconductor substrate 10, the chips subject to the overlapping exposing process are indicated by reference numeral 8. The chips at the right edge of the semiconductor substrate 10, that is, the chips indicated by reference numeral 9 are subject to a single exposing process. The shot for the chips 9 serves as a dummy shot. After reviewing FIG. 5, persons of ordinary skill in the art will readily appreciate that the illustrated method can further reduce unused regions at the edge of the semiconductor wafer in comparison to a conventional method.

Figure 6A:
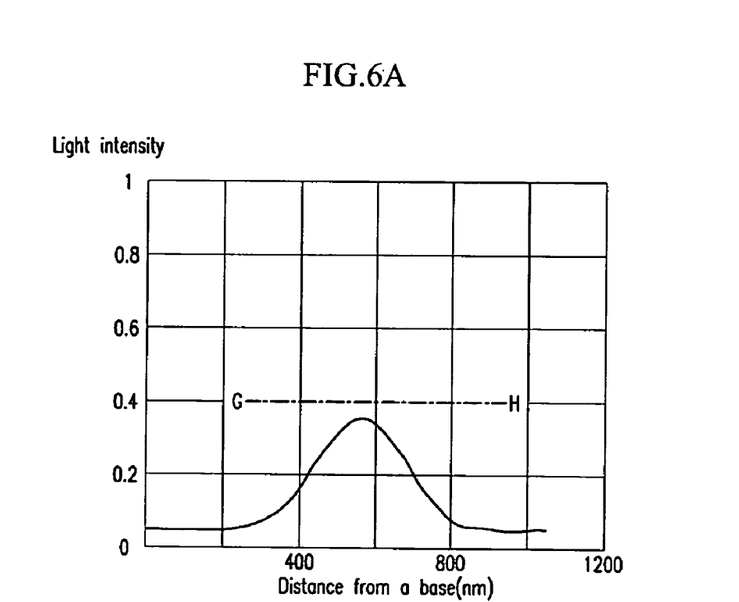
FIGS. 6A to 6C are graphs illustrating an example optical proximity correction method performed in accordance with the teachings of the present invention.
Figure 6B:
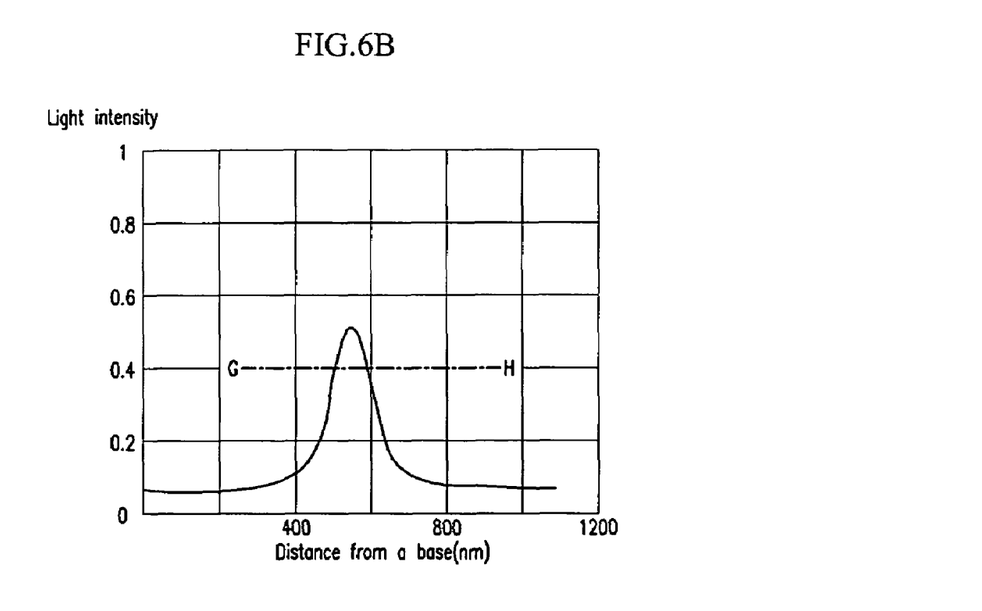
Figure 6C:
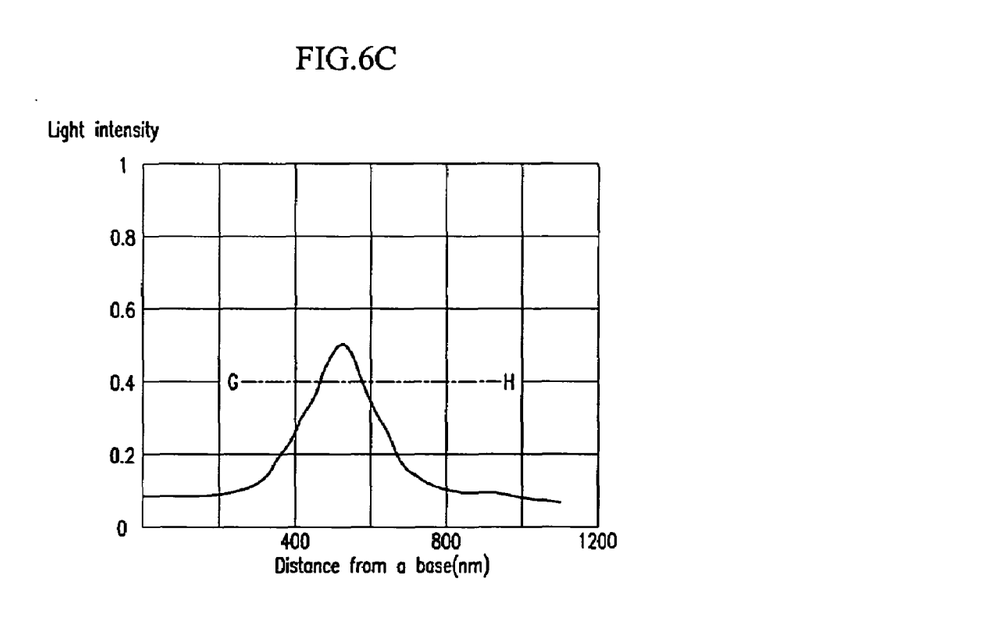

FIGS. 6A to 6C are graphs illustrating an example optical proximity correction method performed in accordance with the teachings of the present invention. In the examples of FIGS. 6A to 6C, normalized image light intensities are depicted with respect to the distance from the base. In a conventional method, a pattern bridge occurs at the cross section G-H when the image light intensity is 0.4 or lower. In an example method performed in accordance with the teachings of the present invention, a first exposing process using the light intensity characteristics represented by FIG. 6A and the leftmost mask pattern 11a of FIG. 4 is performed to form a main image, and then, a second exposing process using the light intensity characteristics represented by FIG. 6B and the rightmost mask pattern 11b of FIG. 4 is performed to overlap a fine auxiliary pattern image 5a on the main image. The peak image light intensity of the second exposing process is over 0.5 at the cross section G-H.

In FIG. 6C, an example image light intensity obtained by applying the image light intensity of FIG. 6B to the rightmost mask in overlapping relation to a pattern created by applying the image light intensity of FIG. 6A to the left mask of FIG. 4 is depicted with respect to the distance from the base. If the exposing light is insufficient as shown in FIG. 6A, an overlapping exposing process using the light intensity characteristics of FIG. 6B and the rightmost mask pattern 11b of FIG. 4 is performed, so that the peak image light intensity is increased to over 0.4. Therefore, pattern bridges can be completely removed by the overlapping exposing process (see 5a, 6b, 7c of FIG. 7)

Figure 7:
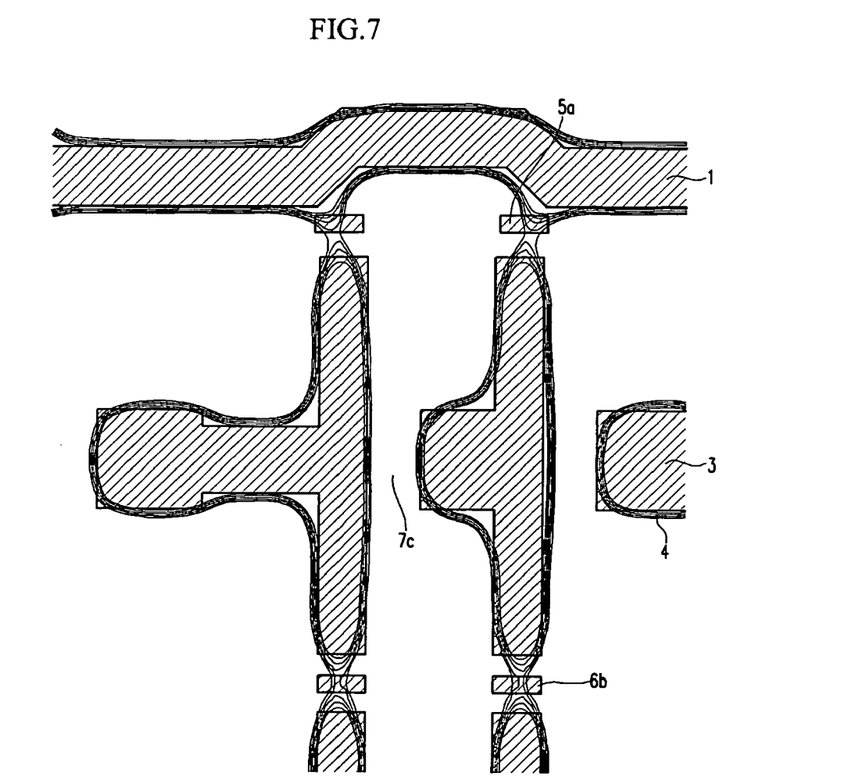
FIG. 7 is a schematic illustration showing an example mask where pattern bridges are removed by using an example overlapping exposing process performed in accordance with the teachings of the present invention.

FIG. 7 is a schematic illustration showing an example pattern where the pattern bridges have been removed by using the example overlapping exposing process described above. As shown in FIG. 7, it can be seen that the pattern bridges are removed at the regions 5a, 5b, and 7c.

From the foregoing, persons of ordinary skill in the art will readily appreciate that pattern bridge regions in repeated patterns of a poly-cell transistor device can be selectively removed. Therefore, it is possible to easily ensure a process margin.

In addition, persons of ordinary skill in the art will readily appreciate that, because the example overlapping exposing process does not need to use an additional mask, but instead uses different mask patterns 11a, 11b on the same mask, it is possible to suppress mask manufacturing error and easily align the mask patterns.

Persons of ordinary skill in the art will further appreciate that, when the disclosed overlapping mask exposing process is performed, it is possible to maximize the number of net die of a semiconductor substrate and increase the yield.

Persons of ordinary skill in the art will readily appreciate that example masks for semiconductor devices and methods of forming masks for semiconductor devices are disclosed which are capable of effectively correcting pattern distortion(s) due to the optical proximity effect of repeated patterns and of implementing an accurate line width by improving line resolution by using an overlapping exposing process.

A disclosed example mask used to manufacture a semiconductor device comprises: a first mask pattern disposed on a first side of the mask, the first mask pattern including light-blocking patterns and light-blocking fine auxiliary patterns within a light-transmitting region; and a second mask pattern disposed on a second side of the mask, the second mask pattern including light-transmitting fine auxiliary patterns within a light-blocking region, the light-transmitting fine auxiliary patterns being disposed at positions corresponding to the light-blocking fine auxiliary patterns to facilitate an overlapping exposing process.

The second mask pattern may have the opposite tone of the first mask pattern. Further, the second mask pattern may be disposed at a position horizontally-translated from a position of the first mask pattern.

In addition, mask cell patterns, driving element patterns, and fine auxiliary patterns may be disposed as light-blocking regions, and other regions may be light-transmitting regions.

In addition, the light-blocking fine auxiliary patterns and the light-transmitting fine auxiliary patterns may be aligned at the same positions during an overlapping mask exposing process.

Further, the light-blocking fine auxiliary patterns and the light-transmitting fine auxiliary patterns may have a line width less than a resolution of an exposing apparatus.

The light-blocking patterns may be repeated cell patterns for a semiconductor device.

A disclosed example method of forming a mask of a semiconductor device includes: portioning a mask into a first mask region and a second mask region; disposing a first mask pattern on the first mask region, the first mask pattern including mask cell patterns, driving element patterns, and fine auxiliary patterns; and disposing a second mask pattern on the second mask region, the second mask pattern having an opposite tone of the first mask pattern, the second mask pattern including fine auxiliary patterns disposed at positions horizontally-translated from positions of the fine auxiliary patterns of the first mask pattern.

The light-blocking patterns and the light-blocking fine auxiliary patterns of the first mask pattern are disposed within a light-transmitting region.

In addition, the fine auxiliary patterns of the second mask pattern may be light-transmitting fine auxiliary patterns within a light-blocking region. The light-transmitting fine auxiliary patterns may be disposed at positions corresponding to the positions of the light-blocking fine auxiliary patterns to facilitate an overlapping exposing process.

Further, the light-blocking fine auxiliary patterns and the light-transmitting fine auxiliary patterns may be aligned at the same positions during a mask exposing process.

From the foregoing, persons of ordinary skill in the art will appreciate that pattern bridge regions in repeated patterns of a poly-cell transistor device can be selectively removed via the disclosed methods, so that process margin can be easily ensured. In addition, an overlapping exposing process which does not use two masks, but instead uses only one mask with two mask patterns is performed, so that mask manufacturing error can be suppressed.

It is noted that this patent claims priority from Korean Patent Application Serial Number 10-2003-0098321, which was filed on Dec. 27, 2003 and is hereby incorporated by reference in its entirety.

Although certain example methods, apparatus and articles of manufacture have been described herein, the scope of coverage of this patent is not limited thereto. On the contrary, this patent covers all methods, apparatus and articles of manufacture fairly falling within the scope of the appended claims either literally or under the doctrine of equivalents.

What is claimed is:

1. A mask to manufacture a semiconductor device comprising:
    a first mask pattern on a first side of the mask, the first mask pattern including a light-blocking pattern comprising (i) a plurality of cell patterns corresponding to structures in the device and (ii) a light-blocking fine auxiliary pattern within a light-transmitting region between cell patterns in said light-blocking pattern at locations corresponding to where a bridge may form on the device, wherein the light-blocking fine auxiliary pattern is disconnected from the cell patterns and is completely surrounded by the light-transmitting region; and
    a second mask pattern on a second side of the mask, the second mask pattern including a light-transmitting fine auxiliary pattern within a light-blocking region, the light-transmitting fine auxiliary pattern being disposed at a position corresponding to a position of the light-blocking fine auxiliary pattern to facilitate an overlapping exposing process wherein the second mask has an opposite tone from the first mask pattern, and wherein the second mask pattern is disposed at a position horizontally-translated from a position of the first mask pattern.

2. A mask as defined in claim 1, wherein mask cell patterns, driving element patterns, and fine auxiliary patterns are represented by light-blocking regions in the first mask pattern, and wherein regions which are not mask cell patterns or driving element patterns are represented by light-transmitting regions.

3. A mask as defined in claim 1, wherein the light-blocking fine auxiliary patterns and the light-transmitting fine auxiliary patterns are aligned during a mask exposing process.

4. A mask as defined in claim 1, wherein the light-blocking fine auxiliary patterns and the light-transmitting fine auxiliary patterns have a line width less than a resolution of an exposing apparatus.

5. A mask as defined in claim 1, wherein the light-blocking patterns are repeated cell patterns.

6. A method of forming a mask of a semiconductor device comprising:
    portioning a mask into a first mask region and a second mask region;
    disposing a first mask pattern on the first mask region, the first mask pattern comprising a plurality of cell patterns, including a light-blocking mask cell pattern, a light-blocking driving element pattern, and a light-blocking fine auxiliary pattern between cell patterns in said first mask pattern at locations corresponding to where a bridge may form on the device, wherein the light-blocking fine auxiliary pattern is disconnected from the light-blocking mask cell pattern and the light-blocking driving element pattern, and is completely surrounded by light-transmitting regions in the first mask region; and
    disposing a second mask pattern on the second mask region, the second mask pattern having an opposite tone from the first mask pattern, the second mask pattern including a fine auxiliary pattern disposed at a position horizontally-translated from a position of the light-blocking fine auxiliary pattern of the first mask pattern.

7. A method as defined in claim 6, wherein the light-blocking mask cell pattern, the light-blocking driving element pattern, and the light-blocking fine auxiliary pattern of the first mask pattern are disposed within a light-transmitting region.

8. A method as defined in claim 7, wherein the fine auxiliary pattern of the second mask pattern is a light-transmitting fine auxiliary pattern within a light-blocking region, and wherein the light-transmitting fine auxiliary pattern is disposed at a position corresponding to a position of the light-blocking fine auxiliary pattern to facilitate an overlapping exposing process.

9. A method as defined in claim 8, wherein the light-blocking fine auxiliary pattern and the light-transmitting fine auxiliary pattern are aligned during the overlapping exposing process.

10. A method as defined in claim 6, wherein light-transmitting regions of the second mask consist essentially of the fine auxiliary patterns.

11. A method as defined in claim 6, wherein disposing the first mask pattern comprises a first exposing process, and disposing a second mask pattern comprises a second exposing process.

12. A method as defined in claim 11, wherein a peak image light intensity of the second exposing process is over 0.5.

13. A method as defined in claim 8, wherein the overlapping exposing process completely removes pattern bridges.

14. A mask as defined in claim 1, wherein the device is a poly-cell transistor.

15. A mask as defined in claim 1, wherein the overlapping exposing process suppresses mask manufacturing error.

16. A method as defined in claim 6, wherein disposing first and second mask patterns maximizes a number of net die on a semiconductor substrate.

17. A mask as defined in claim 1, wherein the mask effectively corrects pattern distortion(s) due to an optical proximity effect.

18. A mask as defined in claim 1, wherein the overlapping exposing process improves line resolution.

19. A method as defined in claim 6, wherein disposing first and second mask patterns effectively corrects pattern distortion(s) due to an optical proximity effect.

* * * * *

UNITED STATES PATENT AND TRADEMARK OFFICE
CERTIFICATE OF CORRECTION

PATENT NO.        : 7,655,362 B2                                              Page 1 of 2
APPLICATION NO. : 11/022628
DATED             : February 2, 2010
INVENTOR(S)       : Jun Seok Lee It is certified that error appears in the above-identified patent and that said Letters Patent is hereby corrected as shown below:

Delete Title Page illustrating a Figure, and replace with new Title Page illustrating a Figure.

Replace Figure 4 with the following drawing:

Signed and Sealed this

Twenty-fourth Day of August, 2010

David J. Kappos
*Director of the United States Patent and Trademark Office*

CERTIFICATE OF CORRECTION (continued)

(12) United States Patent
Lee (10) Patent No.: US 7,655,362 B2
(45) Date of Patent: Feb. 2, 2010

(54) MASKS OF SEMICONDUCTOR DEVICES AND METHODS OF FORMING MASK PATTERNS

(75) Inventor: Jun Seok Lee, Goyang (KR)

(73) Assignee: Dongbu Electronics Co., Ltd., Seoul (KR)

( * ) Notice: Subject to any disclaimer, the term of this patent is extended or adjusted under 35 U.S.C. 154(b) by 704 days.

(21) Appl. No.: 11/022,628

(22) Filed: Dec. 27, 2004

(65) Prior Publication Data
US 2005/0142457 A1 Jun. 30, 2005

(30) Foreign Application Priority Data
Dec. 27, 2003 (KR) .................. 10-2003-0098321

(51) Int. Cl.
*G03F 1/00* (2006.01)
(52) U.S. Cl. .................................. 430/5; 430/394
(58) Field of Classification Search .................. 430/5, 430/311, 322, 394
See application file for complete search history.

(56) References Cited

U.S. PATENT DOCUMENTS

| | | | | |
|---|---|---|---|---|
| 5,439,764 A * | 8/1995 | Alter et al. | | 430/5 |
| 5,585,210 A * | 12/1996 | Lee et al. | | 430/5 |
| 5,827,623 A * | 10/1998 | Ishida et al. | | 430/5 |
| 6,338,922 B1 * | 1/2002 | Liebmann et al. | | 430/5 |
| 6,818,480 B2 * | 11/2004 | Lee et al. | | 438/128 |
| 2002/0025479 A1* | 2/2002 | Okamoto et al. | | 430/5 |
| 2002/0127479 A1* | 9/2002 | Pierrat | | 430/5 |
| 2004/0053141 A1* | 3/2004 | Pierrat | | 430/5 |
| 2005/0136338 A1* | 6/2005 | Chang | | 430/5 |

* cited by examiner

*Primary Examiner*—Mark F Huff
*Assistant Examiner*—Stewart A Fraser
(74) *Attorney, Agent, or Firm*—The Law Offices of Andrew D. Fortney; Andrew D. Fortney (57) ABSTRACT

Masks for semiconductor devices and methods of forming masks of semiconductor devices are provided which are capable of improving line resolution. A disclosed mask includes: a first mask pattern disposed on a first side of the mask. The first mask pattern includes light-blocking patterns and light-blocking fine auxiliary patterns within a light-transmitting region. The mask also includes a second mask pattern disposed on a second side of the mask. The second mask pattern includes light-transmitting fine auxiliary patterns within a light-blocking region. The light-transmitting fine auxiliary patterns are disposed at positions corresponding to the light-blocking fine auxiliary patterns to facilitate an overlapping exposing process. The second mask has the opposite tone of the first mask, and the second mask is disposed at a position horizontally-translated from a position of the first mask. Accordingly, pattern bridge regions in repeated patterns of a poly-cell transistor device can be selectively removed.

19 Claims, 7 Drawing Sheets